United States Patent
Tsuchiya et al.

(10) Patent No.: US 7,596,160 B2
(45) Date of Patent: Sep. 29, 2009

(54) NITRIDE SEMICONDUCTOR LASERS AND ITS MANUFACTURING METHOD

(75) Inventors: Tomonobu Tsuchiya, Hachioji (JP); Shigehisa Tanaka, Koganei (JP); Akihisa Terano, Hachioji (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 11/841,010

(22) Filed: Aug. 20, 2007

(65) Prior Publication Data

US 2008/0247433 A1    Oct. 9, 2008

(30) Foreign Application Priority Data

Apr. 6, 2007    (JP)    ............... 2007-100031

(51) Int. Cl.
*H01S 5/323*    (2006.01)
*H01S 5/00*    (2006.01)
(52) U.S. Cl. ................ 372/45.01; 372/46.01
(58) Field of Classification Search .......... 372/45.01, 372/46.01, 46.013, 46.015
See application file for complete search history.

(56) References Cited

U.S. PATENT DOCUMENTS 6,797,991 B2 *    9/2004    Ishida ................ 257/103

2008/0246053 A1*    10/2008    Miki et al. ................ 257/102

FOREIGN PATENT DOCUMENTS

| JP | 10-093198 | 4/1998 |
| JP | 2000-294883 | 10/2000 |
| JP | 2005-306723 | 11/2005 |

OTHER PUBLICATIONS

M. Ohya, et al.; Highly Reliable Operation of High Power Inner Stripe Blue-Violet Laser Diodes; System Device Research Laboratories, NEC Corporation; m-ohya@ct.ip.nec.ocm; Japan Society of Applied Physics; 2006; 1p-E-8; pp. 361; English language version pp. 1-3.

Susumu Kondo, et al.; Ruthenium-Doped Semi-Insulating InP-Buried InGaAlAs/InAlAs Multi-Quantum-Well Modulators; Japan Society of Applied Physics; Feb. 2002; pp. 1171-1174; vol. 41: Part 1, No. 2B.

Kiyoshi Takahashi, et al.; Wide Bandgap Semiconductors; pp. 386-389.

* cited by examiner

*Primary Examiner*—Armando Rodriguez
(74) *Attorney, Agent, or Firm*—Antonelli, Terry, Stout & Kraus, LLP.

(57) ABSTRACT

A nitride semiconductor laser which features low resistance and high reliability. A buried layer is formed by selective growth and the shape of a p-type cladding layer is inverted trapezoidal so that the resistance of the p-type cladding layer and that of a p-type contact layer are decreased. For long-term reliability of the laser, the buried layer is a high-resistance semi-insulating layer which suppresses increase in leak current.

14 Claims, 10 Drawing Sheets

NITRIDE SEMICONDUCTOR LASERS AND ITS MANUFACTURING METHOD

CLAIM OF PRIORITY

The present application claims priority from Japanese application JP 2007-100031 filed on Apr. 6, 2007, the content of which is hereby incorporated by reference into this application.

FIELD OF THE INVENTION

The present invention relates to a nitride semiconductor laser and a manufacturing method thereof.

BACKGROUND OF THE INVENTION

Metalorganic vapor phase epitaxy has been used as a crystal growth method for nitride semiconductor lasers where the device structure is of the ridge waveguide structure type. In the conventional process of manufacturing a ridge waveguide type, after an oxide film is deposited over a p-type contact layer, part of the oxide film is made a stripe and using the oxide film as a mask, a mesa structure is made through the p-type contact layer by dry-etching a p-type cladding layer. A nitride semiconductor laser thus manufactured is reported to provide excellent properties in device reliability and optical output performance.

On the other hand, the mesa structure of the nitride semiconductor laser is perpendicular or trapezoidal where the mesa width of the p-type contact layer and the mesa width over the p-type cladding layer are generally equal to, or smaller than, the mesa width of the cladding layer in the vicinity of the active layer. Furthermore, in nitride semiconductor devices, since the acceptor level of Mg as a p-type dopant is deeper than in conventional AlGaInP lasers, the acceptor's hole activation rate is low. If the Mg doping concentration is high, defects might occur in the crystal or the device characteristics might deteriorate due to Mg diffusion into the active layer. Hence, the Mg doping concentration should be below a given upper limit and the hole density is lower than in GaAs or InP lasers. For the above reasons, in nitride semiconductor lasers, the device resistance is high and as the mesa width is decreased, the device resistance rapidly increases.

Figure 1:
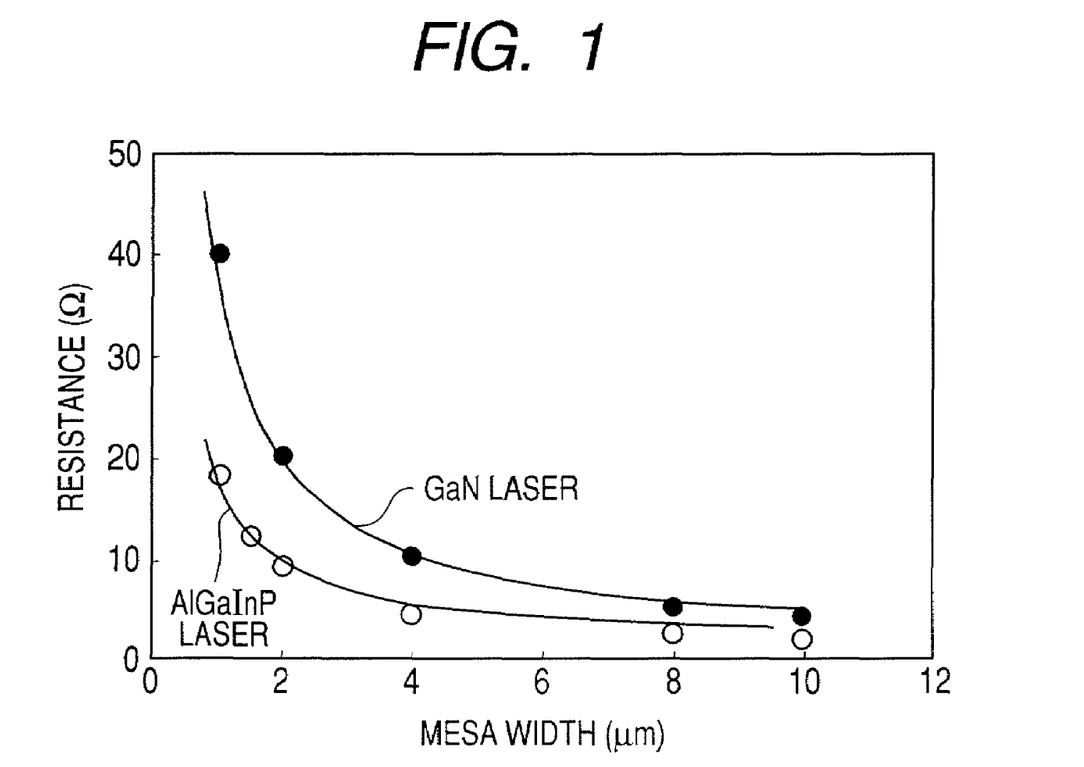
FIG. 1 is a graph showing the relation between device resistance and mesa width for ridge waveguide structure type GaN lasers and ridge waveguide structure type AlGaInP lasers.

Conversely, if the mesa width is increased in order to reduce the device resistance, lateral confinement would be unsatisfactory and kinks would easily occur in current-optical power characteristics at an increased threshold current or high power. For this reason, the operating voltage for nitride semiconductor lasers is higher than that for AlGaInP lasers. FIG. 1 shows relations between mesa width and device resistance for GaN lasers and AlGaInP lasers, demonstrating that the resistance of GaN lasers sharply increases as the mesa width decreases.

One solution to this problem is an inner stripe structure type laser as disclosed in the 67th Autumn Meeting, 2006, 7th Japan Society of Applied Physics p. 361, 1p-E-8. In the process of manufacturing such an inner stripe structure type laser, after growth of amorphous AlN thin film over an active layer at low temperature, the AlN layer in the mesa portion is removed by etching and an AlGaN cladding layer and a GaN contact layer are re-grown over the mesa portion and the amorphous AlN layer. Since the bandgap of the AlN layer is larger than that of the AlGaN layer, injection current is blocked by the AlN layer and confined in the mesa portion. Also, since the refractive index of the AlN layer is smaller than that of the AlGaN layer, there is a lateral refractive index difference, which improves the optical confinement efficiency. Therefore, in this conventional technique, the widths of the cladding layer and contact layer are much larger than the mesa width, increase in device resistance can be reduced even if the mesa width is decreased. However, in this technique, due to the presence of the amorphous AlN layer which has grown over the current blocking layer at low temperature, some difficulty exists in achieving high quality crystallinity on the regrowth interface or the AlGaN cladding layer over the AlN layer.

Another conventional technique is buried type lasers as described in JP-A No. 10 (1998)-93198 and JP-A No. 2000-294883.

In the manufacturing process for the buried type laser described in JP-A No. 10 (1998)-93198, after layers up to a p-type AlGaN cladding layer are stacked, a mesa structure is formed by dry-etching the layers down to the n-type GaN layer and Zn (zinc)-doped GaN as a p-type dopant is filled on lateral sides of the mesa structure to make a high resistance buried GaN layer. A GaN contact layer doped with p-type dopant Mg (magnesium) is formed over the buried layer and the mesa. Hence the contact layer area is wide. However, the mesa structure is perpendicular or trapezoidal because it is formed by dry etching and it is difficult to reduce the resistance of a layer over the cladding layer. Besides, since Zn is an easy-to-diffuse dopant, it may diffuse into the active layer during formation of the buried layer, resulting in an increase in the resistance of the active layer. Furthermore, since the buried layer on the lateral sides of the mesa structure is a high resistance GaN layer containing no Al, the lateral current blocking effect or refractive index difference is small and thus the injection current is small or the optical confinement efficiency is low.

The laser described in JP-A No. 2000-294883, uses, as a buried layer, an undoped AlGaN layer which is equal in growth temperature to MQW. Because of the use of an AlGaN buried layer, the lateral refractive index difference can be increased, and due to low growth temperature, crystallinity of the active layer hardly deteriorates; however, since the AlGaN layer is undoped, the current blocking function for the interface and buried layer is insufficient. On the other hand, buried type semiconductor lasers include InP semiconductor lasers for optical communications which typically have a buried structure having p-type and n-type InP layers stacked alternately, or a structure having a buried semi-insulating layer doped with Fe (iron). Nevertheless, if GaN or AlGaN lasers employ p-type and n-type buried layers, it is difficult to form a high-concentration p-type layer or finely control the shape of a buried structure. Besides, if Mg or Zn is used as a dopant for p-type or high resistance layers, crystallinity might deteriorate due to diffusion of Mg or Zn into the active layer.

SUMMARY OF THE INVENTION

An object of the present invention is to improve the characteristics of a nitride semiconductor laser without deterioration in long-term reliability and manufacturing yield. Therefore it is intended to reduce the device resistance and lower the threshold current value easily without deterioration in optical confinement efficiency and regrowth interface crystallinity.

One aspect of the present invention is as follows.

A nitride semiconductor laser includes: an n-type cladding layer, an active layer, a p-type cladding layer, and a p-type contact layer which are all formed over a semiconductor substrate; and the cross section of the p-type cladding layer partially includes an inverted trapezoidal portion, and a semi-insulating AlGaN layer is buried on both lateral sides of the inverted trapezoidal portion of the p-type cladding layer, and the p-type cladding layer lies over the AlGaN layer continuously with the inverted trapezoidal portion of the p-type cladding layer, and the p-type contact layer lies over it.

Figure 2:
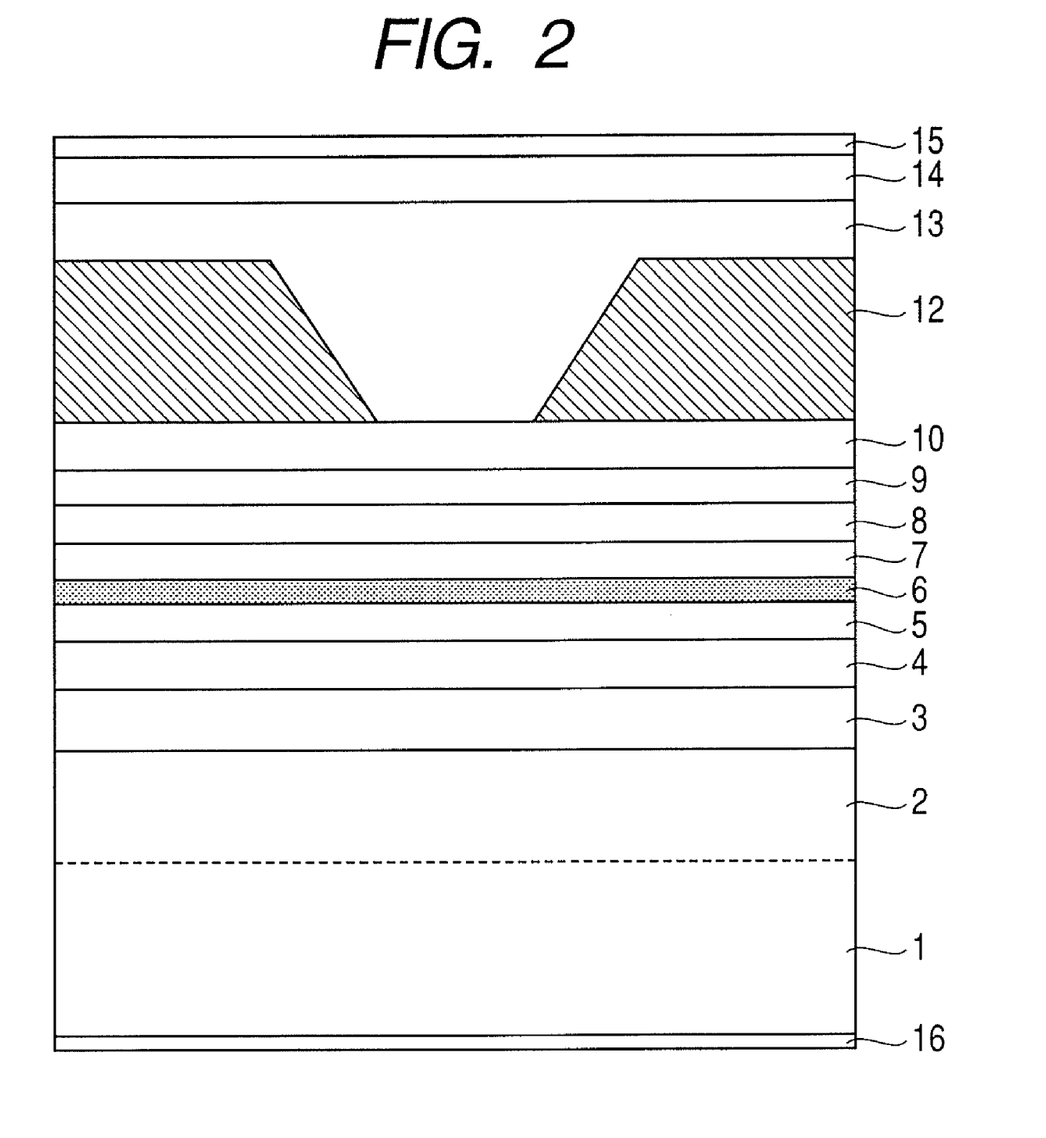
FIG. 2 schematically shows the cross section of a semiconductor multilayered structure according to a first embodiment of the invention.
Figure 3:
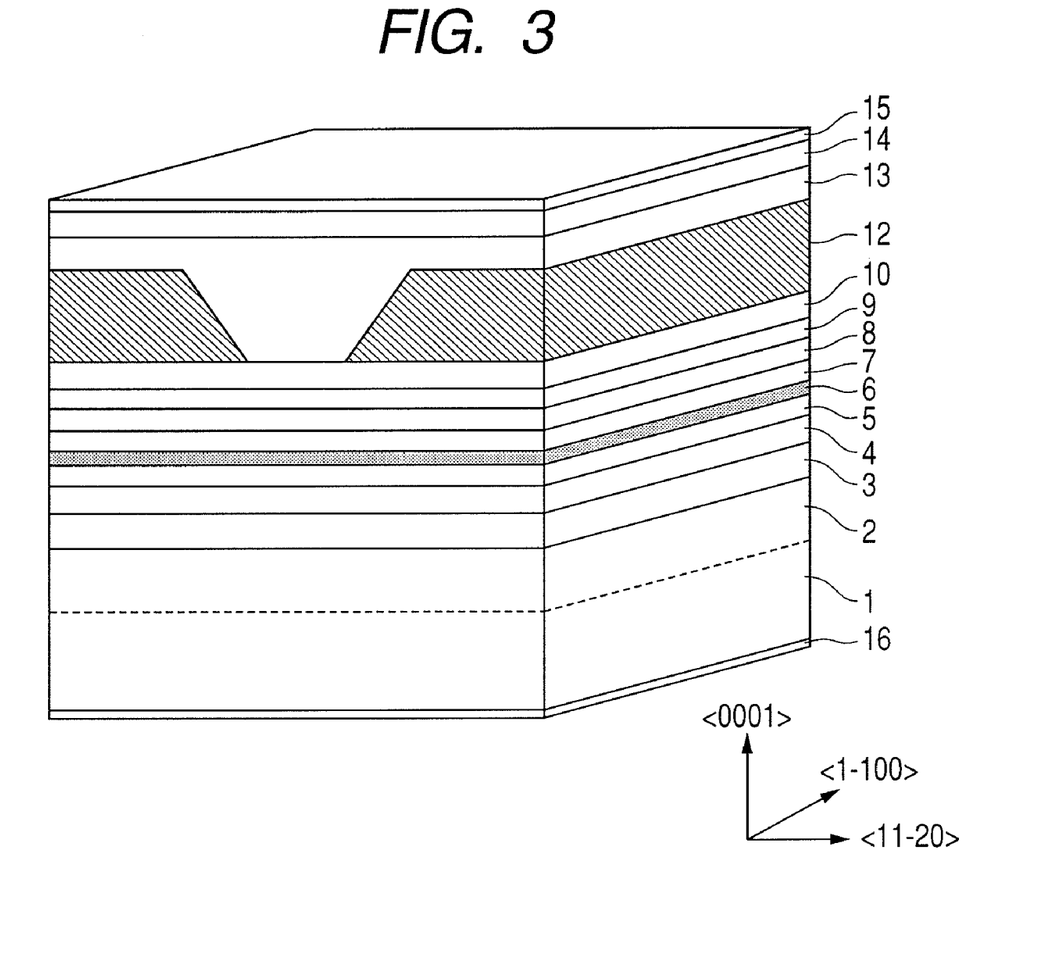
FIG. 3 is a perspective view of the semiconductor laser structure according to the first embodiment.
Figure 6:
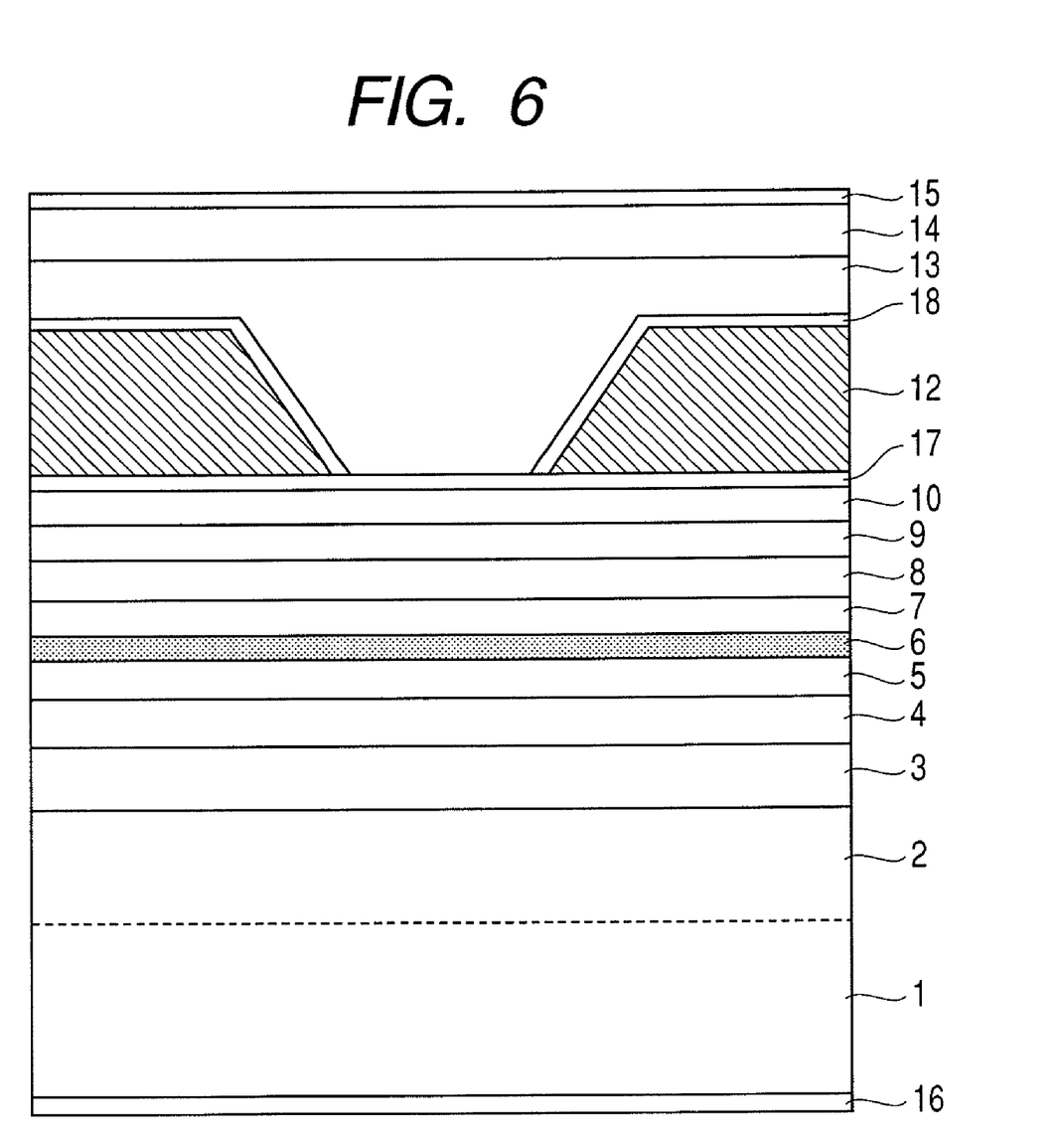
FIG. 6 schematically shows the cross section of a semiconductor multilayered structure according to a second embodiment of the invention.

This structure corresponds to what is shown in FIGS. 2, 3 and 6.

Specifically, the contact width of the p-type contact layer and the mesa width of the p-type cladding layer are increased and crystal with a large refractive index difference is used for the buried layer. Here, fine shape control is unnecessary and leak current in regrowth interfaces is reduced.

For the purpose of decreasing the device resistance, the buried structure type is employed and a wide p-type contact layer is formed over the mesa and over the buried layer in order to decrease the resistance of the p-type contact layer. Also, in order to decrease the resistance of the p-type cladding layer, its shape is inverted trapezoidal and the mesa width of the upper cladding layer is broadened.

Specifically, after formation of a flat multilayer film up to just above the active layer, a high-resistance buried layer is formed by selective growth using a mask and the growth pattern (shape) of the buried layer at the mask edge is limited to form a tilted surface. After that, the mask is removed and a p-type cladding layer is grown so as to have an inverted trapezoidal shape.

Regarding the relation between selective growth pattern and growth condition, the shape at the mask edge is perpendicular or oblique depending on growth condition and mask stripe direction, as described on pages 386-389 of "Wide Bandgap Semiconductors" authored by Takahashi and Yoshikawa. Particularly regarding the growth pattern at the mask edge, if the mesa stripe is oriented toward the <11-20> direction, it would be easy to form a tilted surface (for example, (1-101)) but due to difficulty in cleavage, laser facet formation by dry etching would be needed.

On the other hand, semiconductor laser facets are generally formed by cleavage and facets formed by cleavage have less crystal defects than those by dry etching and facet formation by cleavage is easier. For this reason, the direction of the stripe is the <1-100> direction and the (1-100) surface is a cleavage plane. The growth condition should be so determined that the growth pattern at the mask edge leads to formation of an oblique or tilted surface (for example, the (11-22) surface) and in order to reduce crystallinity deterioration attributable to the thermal history in regrowth, a relatively low temperature and a normal pressure are used for growth.

According to the hexagonal crystal notation "Miller-Bravais Index, <abcd> denotes a direction and (abcd) denotes a surface orientation. Furthermore, abc denotes an in-plane coordinate axis in a hexagonal system and d denotes a coordinate axis perpendicular to a hexagonal surface and for a hexagonal crystal axis, the following relation exists: c=-(a+b). In the present invention, the symbol-(minus) denotes an inverse direction: for example, (0001) and (000-1) correspond to the upward facing surface and downward facing surface of an interface.

As far as injection current and optical confinement in a buried structure are concerned, an AlGaN layer which has a larger bandgap than the active layer is used for the buried layer to provide a lateral current blocking effect and refractive index difference in order to improve injection current and optical confinement efficiencies. Since the MQW active layer is an InGaN layer, the buried layer can be a GaN layer; however, in order to increase the refractive index difference and bandgap difference as far as possible, an AlGaN layer is used as the buried layer because the In (indium) compositional rates of the optical guide layer and barrier layer are usually as low as several percent.

For long-term reliability of a buried type device, a semi-insulating layer is used as the buried layer in order to block leak current into the regrowth interface or buried layer. As for the resistivity of the buried layer, the resistivity is $1\times10^4$ Ωcm or more and more preferably $1\times10^7$ Ωcm or more because too low resistivity would cause current to flow into the interface or buried layer with resultant deterioration in the reliability of the device. The upper limit for resistivity is $1\times10^{10}$ Ωcm because too high a doping concentration would generate crystal defects or cause diffusion of Fe as a semi-insulating dopant.

In a certain conventional technique for buried type GaN lasers, the buried layer is a high-resistance layer or insulating film. However, if it is a simple high-resistance layer, minute electric current would flow in the interface or buried layer, which might deteriorate long-term reliability. If it is insulating film, inefficient heat dissipation would make growth of a cladding layer over the insulating film difficult. For the above reasons, the buried layer should be semi-insulating film whose resistivity is in the range from $1\times10^4$ Ωcm to $1\times10^{10}$ Ωcm, and more preferably in the range from $1\times10^7$ Ωcm to $1\times10^{10}$ Ωcm.

For GaN lasers, Fe (iron) is used as a semi-insulating dopant and usable crystal growth methods include hydride vapor phase epitaxy, metalorganic hydrogen chloride vapor phase epitaxy, and metalorganic vapor phase epitaxy. However, hydride vapor phase epitaxy and metalorganic hydrogen chloride vapor phase epitaxy are growth processes for fabricating GaN substrates and in these methods, the growth rate is too high to control the film thickness or shape finely. Hence, in the present invention, metalorganic vapor phase epitaxy is used to grow a buried layer. Ferrocene ($CP_2Fe$: bis-cyclopentadienyl iron) is available as an organic metal material for Fe and a known example of use of Fe in GaN lasers is described in (JP-A No. 2005-306723).

Factors which contribute to long-term reliability of buried type lasers include the use of a high-quality regrowth interface and a semi-insulating dopant with low diffusivity. In order to enhance the quality of the regrowth interface, a thin film GaN layer is used to ensure that the regrowth interface does not contain Al or gas etching is done on the surface layer in the growth reactor during the regrowth period. To address these issues, Ru (ruthenium) may be used as a semi-insulating dopant with low diffusivity instead of Fe. For gas etching in the growth reactor, $H_2$ (hydrogen) carrier gas is used at high temperature and after etching, $N_2$ (nitrogen) carrier gas is used for protection of the interface to prevent unwanted etching. Processes for gas etching with hydrogen gas in a growth reactor are stated in JP-A No. 10 (1998)-93198 and JP-A No. 2000-294883. In the manufacture of GaN lasers, generally a hydrogen gas atmosphere is used for growth and since the rate of N (nitrogen) desorption is high at high temperature, etching may occur while growth is interrupted. Therefore, in order to prevent unwanted etching which might change the shape, the temperature is raised with nitrogen carrier gas after gas etching in the growth furnace.

Ru may be used as a dopant with low diffusivity instead of Fe. The use of Ru-doped semi-insulating InP for a buried layer is described in Jpn. J Appl. Phys. Vol. 41 (2002) pp. 1171-1174.

According to the present invention, a low-resistance highly reliable nitride semiconductor device (laser, etc) can be realized.

BRIEF DESCRIPTION OF THE DRAWINGS

The invention will be more particularly described with reference to the accompanying drawings, in which:

FIGS. 5A to 5B show various steps of the manufacturing process according to the invention, in which

DETAILED DESCRIPTION OF THE PREFERRED EMBODIMENTS

First Embodiment

Figure 4:
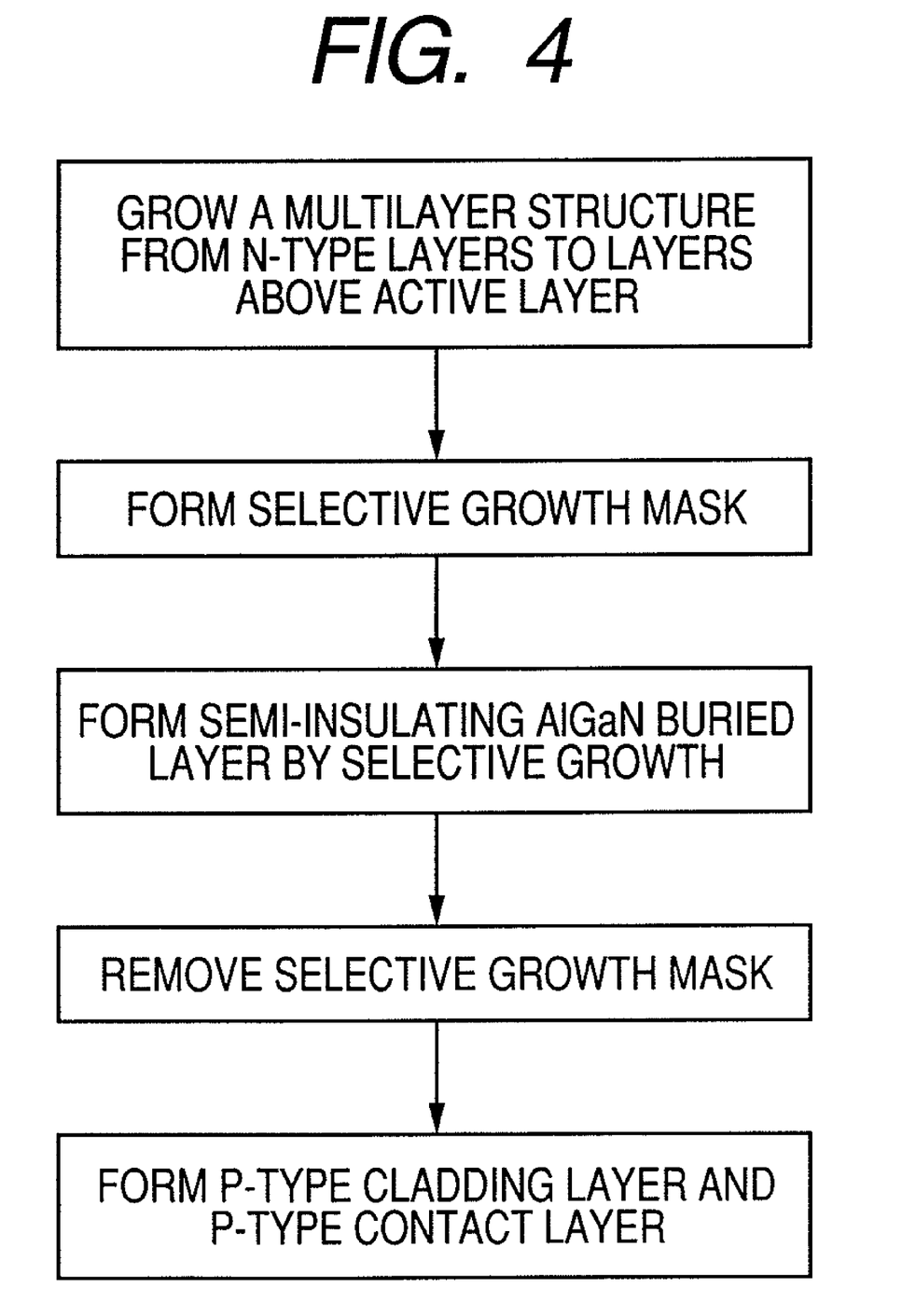
FIG. 4 is a flowchart showing a manufacturing process according to the invention.
Figure 5A:
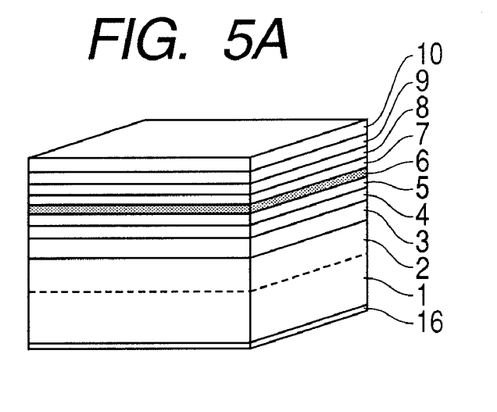
FIG. 5A shows that various layers are formed on a substrate.
Figure 5B:
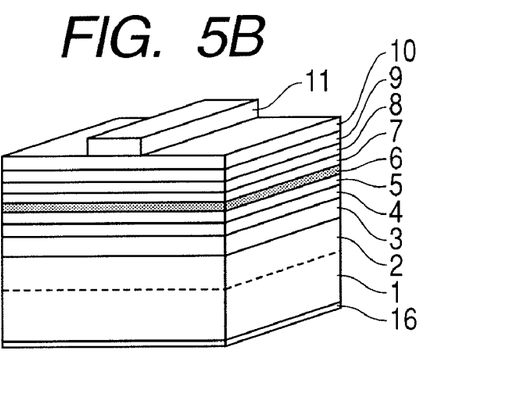
FIG. 5B shows that a stripe is formed by wet etching.
Figure 5C:
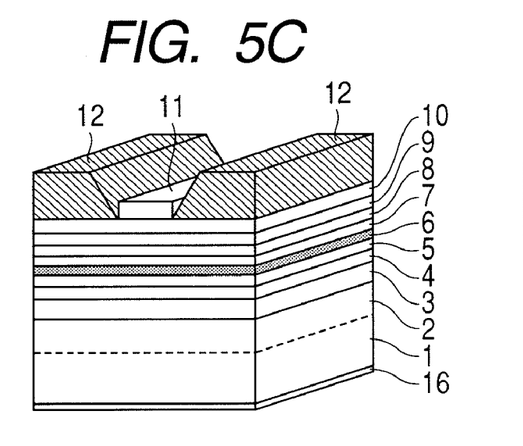
FIG. 5C shows that a buried layer is grown.
Figure 5D:
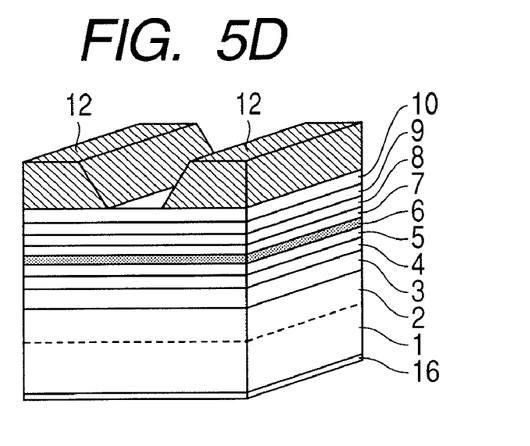
FIG. 5D shows that the stripe is removed by wet etching.

FIG. 2 shows a cross section of a laser according to the invention; FIG. 4 is a perspective view of it; FIG. 4 is a flowchart showing a manufacturing process according to the invention; and FIGS. 5A to 5D are perspective views showing various steps of the manufacturing process. First, the following layers are grown on an n-type GaN substrate 1 in accordance with metalorganic vapor phase epitaxy (0001) in the order of mention: a Si-doped n-type GaN buffer layer 2 (film thickness: 1000 nm, Si concentration: $1\times10^{18}$ cm$^{-3}$); a Si-doped n-type AlGaN cladding layer 3 (Al composition ratio: 0.04, film thickness: 2500 nm, Si concentration: $1\times10^{18}$ cm$^{-3}$); a Si-doped n-type GaN guide layer 4 (film thickness: 100 nm, Si concentration: $5\times10^{17}$ cm$^{-3}$); an undoped InGaN guide layer 5 (In composition ratio: 0.02, film thickness: 30 nm); an undoped InGaN multiquantum well active layer 6 (period: 3, InGaN well layer In composition ratio: 0.10, film thickness 3.5 nm, InGaN barrier layer In composition ratio: 0.02, film thickness; 7 nm); an undoped InGaN guide layer 7 (In composition ratio: 0.02, film thickness: 30 nm); an undoped GaN guide layer 8 (film thickness: 100 nm); a Mg-doped p-type AlGaN electronic stopper layer 9 (Al composition ratio: 0.15, film thickness 10 nm, Mg concentration $1\times10^{19}$ cm$^{-3}$); and a Mg-doped p-type AlGaN cladding layer 10 (Al composition ratio: 0.05, film thickness 20 nm, Mg concentration $2\times10^{19}$ cm$^{-3}$) (see FIG. 5A). Then, an oxide film is deposited over them and a 2 μm-wide stripe 11 is formed by wet etching (see FIG. 5B).

The longitudinal direction of the stripe is the <1-100> direction (see the crystal axis in FIG. 3) and a Fe-doped semi-insulating AlGaN buried layer 12 (Al composition ratio: 0.08, film thickness: 400 nm, resistivity: $10^7$ Ωcm, Fe concentration: $1\times10^{19}$ cm$^{-3}$) is selectively grown at 970° C. at atmospheric pressure (see FIG. 5C). Then, the stripe 11 for selective growth is removed by hydrofluoric acid wet etching (see FIG. 5D). At this moment, the growth surface at the mask edge is tilted and as the temperature is lower and the pressure is nearer to atmospheric pressure, the growth surface at the mask edge is closer to the (11-22) surface. Although in this case 970° C. is used as the growth temperature for the AlGaN buried layer to form the (11-22) surface, another growth temperature may be used taking it into consideration that the buried layer structure may somewhat vary.

There is a tendency of growth pattern and growth temperature as explained below. Generally the growth temperature for a flat film is 1000-1100° C. for GaN and AlGaN lasers and 750-800° C. for InGaN lasers and in respect of selective growth patterns, surface migration is suppressed due to the presence of Al and there is some tendency that a tilted surface is produced at high temperature. On the other hand, in case of growth of AlGaN at low temperature, since the residual impurity concentration slightly increases, it is desirable that the growth temperature for AlGaN should be slightly higher than the selective growth temperature for GaN in the conventional technique. The direction of the stripe should be the <1-100> direction because a laser facet is formed by cleavage.

After that, a Mg-doped AlGaN p-type cladding layer 13 (Al composition ratio: 0.05, film thickness: 550 nm, Mg concentration: $2\times10^{19}$ cm$^{-3}$) and a Mg-doped GaN contact layer 14 (film thickness: 50 nm, Mg concentration: $1.5\times10^{20}$ cm$^{-3}$) are grown (see FIGS. 2 and 3). Furthermore, a p-type electrode 15 and an n-type electrode 16 are vapor-deposited and a laser is produced by cleavage in the <11-20> direction, a direction perpendicular to the stripe. In this embodiment, the area of contact with the electrode in the Mg-doped contact layer may be increased from 2 μm (equivalent to the mesa width), for example, to 150 μm.

Since the shape of the p-type cladding layer changes from perpendicular to inverted trapezoidal, the width of the upper cladding layer may be broadened from 2 μm to approx. 3 μm.

As a consequence, the device resistance can be decreased from approx. 35Ω to 20Ω.

Although in this embodiment the Fe concentration of the buried layer is $1\times10^{19}$ cm$^{-3}$, the optimum Fe concentration depends on the residual carrier concentration, which means that if the residual carrier concentration is lower, a lower Fe concentration may be used. However, if doped at a high concentration, Fe easily diffuses as a dopant and its diffusion into the active layer could result in a larger threshold current value or decline in optical output power. For a Fe-doped GaN layer, the Fe concentration should be in the range of approx. $1\times10^{17}$ cm$^{-3}$ to approx. $1\times10^{20}$ cm$^{-3}$, and more preferably around $1\times10^{19}$ cm$^{-3}$ because a too high concentration may result in a new defect or surface homology deterioration. Although in the present invention the buried layer film thickness is 400 nm, it need not be 400 nm. However, it should be noted that if the layer is too thin, some leak current would be generated in the presence of an electric field and if too thick, the p-type cladding layer should also be thicker and the resistance would be larger. Therefore, it is desirable that the buried layer film thickness should be 300 nm or more and 1000 nm or less. Although in the present invention the Al composition ratio of the buried layer is 0.08 and that of the p-type cladding layer is 0.05, other Al composition ratios may be used.

However, in order to block electric current or confine light laterally, it is desirable that the Al composition ratio of the buried layer should be higher than that of the cladding layer.

Although in this embodiment the stripe is parallel to the <1-100> direction because a laser facet is formed by cleavage, if a laser facet is formed by dry etching, its direction may be different. However, generally speaking, since facet formation by cleavage causes less damage, it is desirable that the direction of the stripe be <1-100>. Although this embodiment uses oxide film for the mask for selective growth, nitride film may be used for the mask as far as it generates less deposited matter on the mask and the mask can be removed after selective growth.

An advantageous effect of this embodiment is as follows. When conventional p-type and n-type current blocking layers are used, the buried layer has many defects and the p-type dopant concentration is low and thus the current blocking function of the buried layer is insufficient, which means that the threshold current value is the same as in the case of the ridge waveguide structure type and long-term reliability is unsatisfactory (100 hours or so). By contrast, in this embodiment, the semi-insulating Fe-doped AlGaN layer blocks current, which means that leak current and defects hardly increase. In terms of resistivity, as shown in Table 1, as the insulation performance is enhanced, reliability is improved. Therefore, the resistivity of the buried layer should be $10^4$ $\Omega$cm or more and more preferably $10^7$ $\Omega$cm or more. Concretely, this embodiment achieves a long-term reliability of 2000 hours or more at 100 mW optical power.

TABLE 1

Buried Layer Resistivity and Laser's Long-term Reliability

| Resistivity of Buried Layer ($\Omega$cm) | Laser's Long-term Reliability (hours) |
|---|---|
| $5 \times 10^2$ | 100 |
| $1 \times 10^4$ | 1000 |
| $1 \times 10^7$ | 2000 |

Second Embodiment

FIG. 6 shows that a Fe-doped GaN buried layer is added to the upper surface, tilted surface and lower surface of an AlGaN buried layer according to the present invention. Like the first embodiment, in accordance with metalorganic vapor phase epitaxy, after growth of a Mg-doped p-type AlGaN cladding layer 10 (Al composition ratio: 0.05, film thickness: 20 nm, Mg concentration: $2 \times 10^{19}$ cm$^{-3}$), a Mg-doped p-type GaN layer 17 (film thickness: 10 nm, Mg concentration: $2 \times 10^{19}$ cm$^{-3}$) is grown, and an oxide mask stripe 11 is formed, then an AlGaN buried layer 12 (Al composition ratio: 0.08, film thickness: 500 nm, Fe concentration: $1 \times 10^{19}$ cm$^{-3}$, resistivity: $10^7$ $\Omega$cm) is grown; furthermore a Fe-doped GaN buried layer 18 (film thickness: 10 nm, Fe concentration: $1 \times 10^{19}$ cm$^{-3}$, resistivity: $10^7$ $\Omega$cm) is grown. Through the same process as in the first embodiment, a Mg-doped AlGaN p-type cladding layer 13 and a p-type contact layer 14 are grown over the Mg-doped p-type GaN layer 17 and a laser is produced by cleavage. In this embodiment, the regrowth interface of the buried layer and the regrowth interfaces of the cladding layers are all GaN layers and there is no regrowth of an AlGaN layer as seen in the first embodiment, leading to less surface oxidation on regrowth interfaces. Consequently low-defect regrowth interfaces are obtained.

Figure 7:
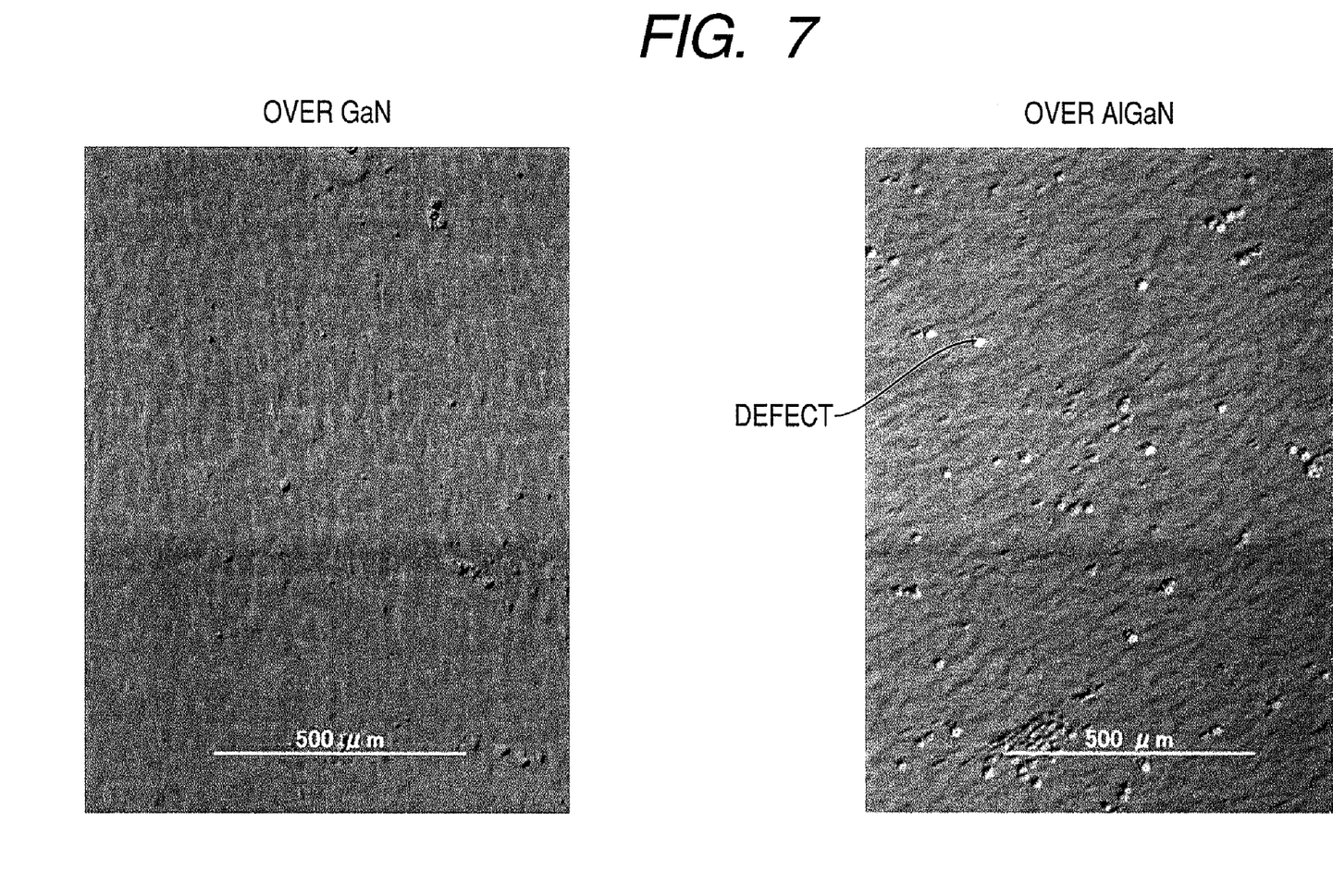
FIG. 7 shows photos of surface homology demonstrating an effect of the invention.

FIG. 7 shows surface morphology of the regrown GaN layer over GaN and over AlGaN; in this embodiment, the addition of the GaN layers reduces surface layer oxidation and decrease defects in regrowth. Hence, the crystallinity of the p-type cladding layer is improved and higher long-term reliability is achieved as compared with the first embodiment. Concretely this embodiment achieves a long-term reliability of 3000 hours or more at 100 mW optical power. Although in this second embodiment the GaN layers lie on the upper surface, tilted surface, and lower surface of the AlGaN buried layer, instead, GaN layers may lie only on the upper surface and tilted surface of the AlGaN buried layer. In that case, the advantageous effect is smaller than in the second embodiment but slightly larger than in the first embodiment. In the latter case, a long-term reliability of 2500 hours or more at 100 mW optical power is achieved.

Third Embodiment

Figure 8:
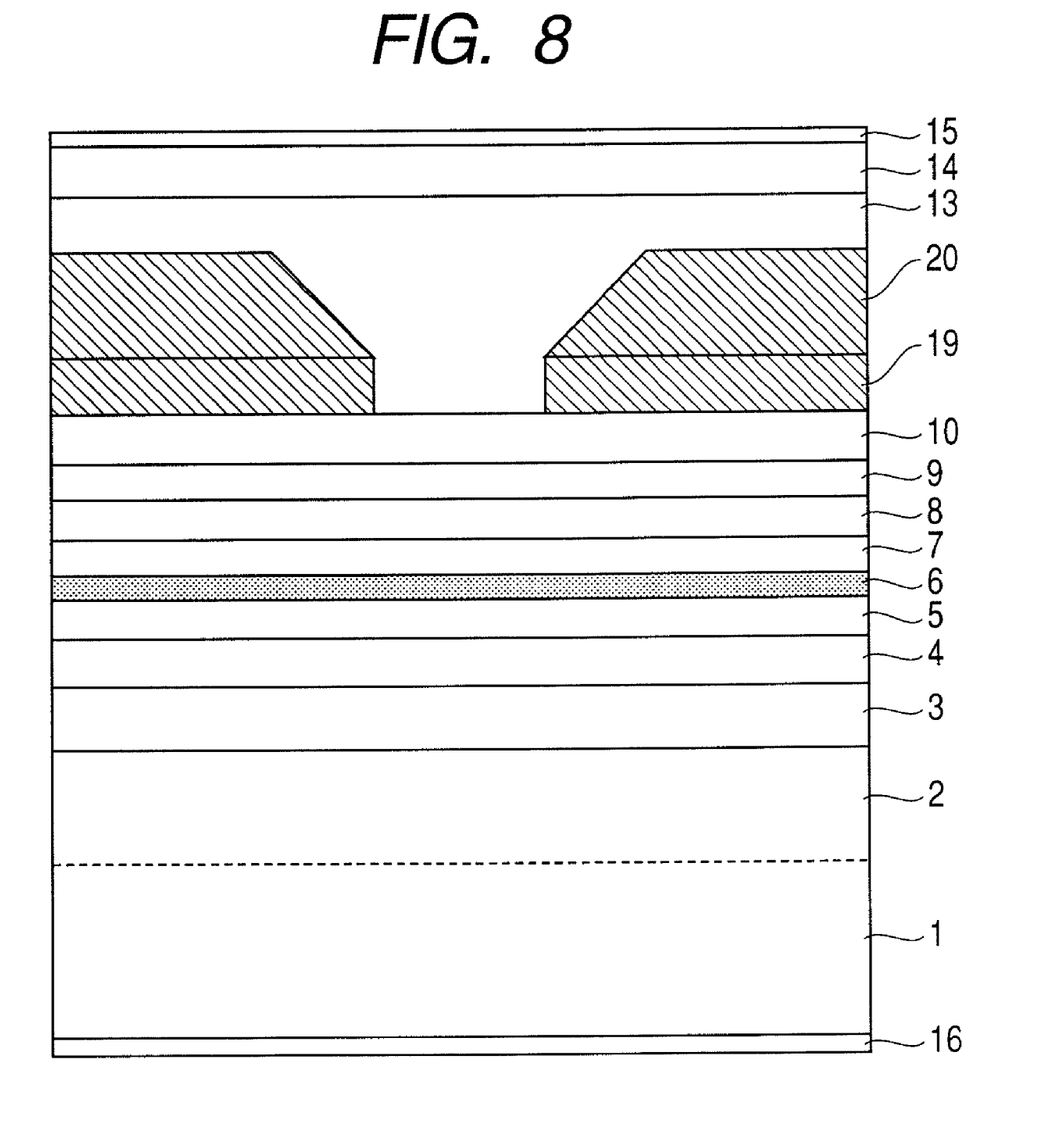
FIG. 8 schematically shows the cross section of a semiconductor multilayered structure according to a third embodiment of the invention.

FIG. 8 shows a case that the growth condition for the Fe-doped AlGaN buried layer according to the present invention is changed. After formation of a mask stripe 11 through the same process as in the first and second embodiments, in accordance with metalorganic vapor phase epitaxy, a Fe-doped semi-insulating AlGaN buried layer 19 (Al composition ratio: 0.08, film thickness: 200 nm, Fe concentration: $1 \times 10^{19}$ cm$^{-3}$, resistivity: $10^7$ $\Omega$cm) is grown at 1050° C. and 0.1 pressure, then a Fe-doped semi-insulating AlGaN buried layer 20 (Al composition ratio: 0.08, film thickness: 300 nm, resistivity: $10^7$ $\Omega$cm) is grown at 970° C. and atmospheric pressure. Then, after growth up to a p-type contact layer 14 through the same process as in the first and second embodiments, a device is produced by cleavage.

As in the case of GaN lasers, the growth pattern at the mask edge is closer to the perpendicular pattern ((11-20) surface) as the temperature is higher and the pressure is lower; however, if the growth temperature is too high (for example, 1150° C.), crystallinity of the InGaN active layer deteriorates. Therefore, it is desirable that the growth temperature should be in the range of 1000-1100° C. An advantageous effect of this embodiment is as follows. In this embodiment, Mg is used as the dopant for all p-type layers and the cladding layer has a high Mg concentration of approx. $2 \times 10^{19}$ cm$^{-3}$ and grows at high temperature; consequently, Mg slightly diffuses into the Fe-doped buried layer.

Therefore, if the buried layer edge is acute-angled as in the first and second embodiments, Mg may diffuse and the edge may become a p-type edge, creating a leak path.

By contrast, in this embodiment, because of absence of an acute-angled edge, creation of a leak path due to a p-type edge of the buried layer is less likely. Consequently, although this embodiment, the device resistance is slightly higher, the ability to block current laterally is stronger than in the first and second embodiments, making it possible to decrease the threshold current value from 45 mA to 35 mA. From the viewpoint of device reliability, since acute-angled edges are less likely to become p-type edges and reliability can be thus improved, a long-term reliability of 4000 hours or more can be achieved in this embodiment.

This embodiment does not use Fe-doped GaN layers 17 and 18 as seen in the second embodiment. If GaN layers are used for regrowth interfaces, it will bring about a similar effect that defects in regrowth interfaces are decreased and reliability is improved.

Fourth Embodiment

Figure 9:
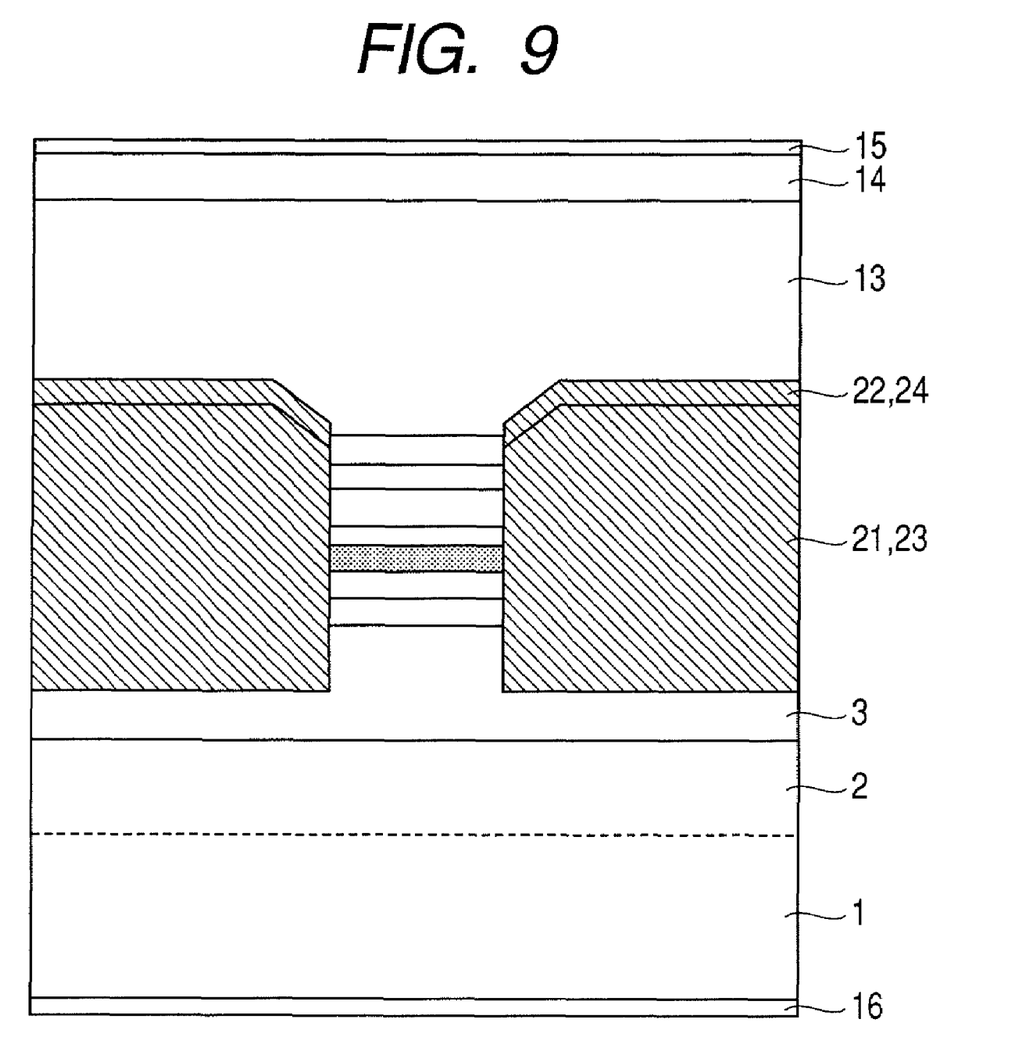
FIG. 9 schematically shows the cross section of a semiconductor multilayered structure according to a fourth embodiment of the invention.

FIG. 9 shows a structure according to the fourth embodiment in which etching is done down to the active layer. After formation of a mask stripe 11 through the same process as in the above embodiments, a mesa with a depth of 700 nm is formed by dry etching. Then, in accordance with metalorganic vapor phase epitaxy, a Fe-doped semi-insulating AlGaN buried layer 21 (Al composition ratio: 0.08, film thickness: 300 nm, Fe concentration: $1 \times 10^{19}$ cm$^{-3}$, resistivity: $10^7$ Ωcm) and a Fe-doped semi-insulating GaN buried layer 22 (film thickness: 50 nm, Fe concentration: $1 \times 10^{19}$ cm$^{-3}$, resistivity: $10^7$ Ωcm) are grown. Then, through the same process as in the above embodiments, a p-type cladding layer 13 and a p-type contact layer 14 are grown and a device is produced by cleavage. In the present invention, a semi-insulating AlGaN layer with a large bandgap is buried on the lateral sides of the active layer so that the current is more blocked laterally.

Whereas current blocking is done in p-type layers in the first to third embodiments, in this embodiment it is possible to block current even in n-type layers and thus the threshold current value can be decreased from 45 mA to approx. 25 mA.

Although the etching depth for the active layer is 700 nm in this embodiment, the required etching depth slightly varies depending on the guide layer film thickness and the active layer structure. Particularly when the etching depth for n-type layers is increased, current blocking can be done mainly in n-type layers and thus the mesa width for p-type layers can be increased.

Since device resistance is mainly determined by p-type layers, drive current and device resistance can be reduced by etching deep into n-type layers. Therefore, if the etching depth is 1000 nm and the height of the tilted surface of the p-type cladding layer is reduced to 150 nm and the width of the rest of the p-type cladding layer is the same as the width of the contact layer, drive voltage can be reduced by 20 percent and the threshold current value can be decreased to 18 mA.

Fifth Embodiment

Figure 10:
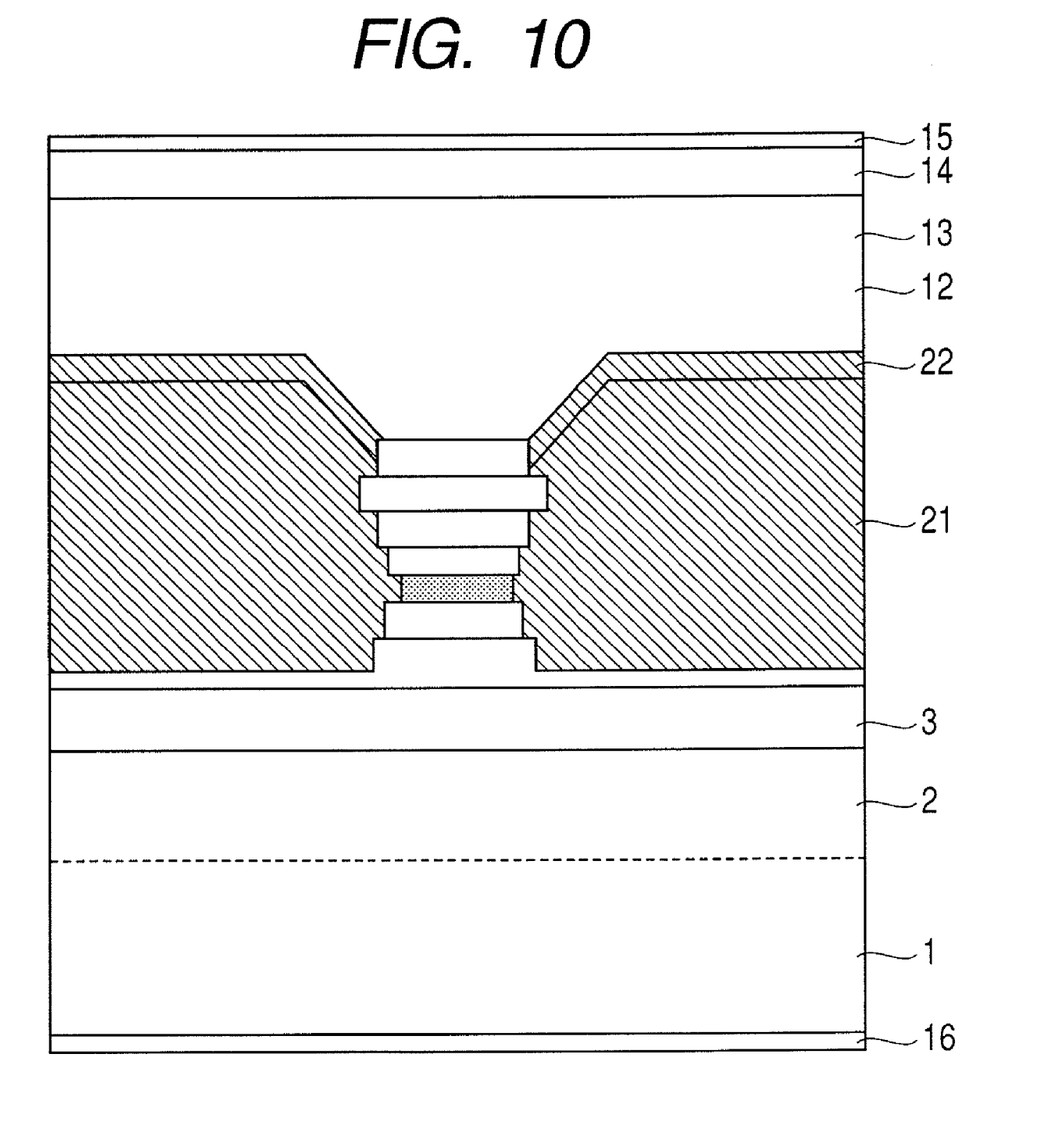
FIG. 10 schematically shows the cross section of a semiconductor multilayered structure according to a fifth embodiment of the invention.

FIG. 10 shows a buried layer structure with an enhanced regrowth interface quality in which etching is done down to the active layer.

A mesa with a depth of 700 nm is formed by dry etching through the same process as in the fourth embodiment. Then, in a metal organic chemical vapor deposition apparatus, the hydrogen atmosphere temperature is increased to 1100° C. and the surface layers on the mesa lateral sides are etched by approx. 20-80 nm in the growth reactor. Successively the temperature is decreased down to 970° C. in the growth reactor; then a Fe-doped semi-insulating AlGaN buried layer 21 (Al composition ratio: 0.08, film thickness: 300 nm, Fe concentration: $1 \times 10^{19}$ cm$^{-3}$, resistivity: $10^7$ Ωcm) and a Fe-doped semi-insulating GaN buried layer 22 (film thickness: 50 nm, Fe concentration: $1 \times 10^{19}$ cm$^{-3}$, resistivity: $10^7$ Ωcm) are grown.

After that, a p-type cladding layer 13 and a p-type contact layer 14 are grown through the same process as in the above embodiments and a device is produced by cleavage. In this embodiment, since a surface damaged layer or naturally oxidized film is removed by etching in the growth reactor to enable continuous growth, defects in regrowth interfaces are decreased. Hence, an advantageous effect of this embodiment is that the long-term reliability of the device is approx. 30 percent higher than in the fourth embodiment and a long-term reliability of 4000 hours or more at 100 mW optical power is achieved.

As shown in FIG. 10, the grown layers in the vicinity of the active layer of the multilayered structure are different in mesa width, which reflects the difference in etching rate in the growth furnace where the relation in etching rate among these layers is expressed by AlGaN<GaN<InGaN. Therefore, if the amount of etching in the growth furnace is large, level differences on mesa lateral sides may be significant, making it difficult to bury layers flatly.

Conversely, if the amount of etching is small, surface-oxidized film, particularly AlGaN surface-oxidized film, cannot be removed properly. For the above reasons, the lateral etching pattern depends on the multilayered structure (composition and film thickness). Although in this embodiment the amount of etching for the mesa lateral sides is 20-80 nm, it may be different from this as far as it is within the range of 10-200 nm.

The Fe dopant growth material as used in the first to fifth embodiments is typically CP$_2$Fe (bis-cyclopentadienyl iron: ferrocene). Other typical organic metal materials available as growth materials are TMIn (trimethylindium), TMGa (trimethylgallium), TEGa (triethylgallium) and TMAl (trimethylaluminum) and NH$_3$ as a group V material.

Sixth Embodiment

This embodiment uses Ru as a semi-insulating dopant. After formation of a mask stripe 11 through the same process as in the above embodiments, in accordance with metalorganic vapor phase epitaxy, a Ru-doped semi-insulating AlGaN buried layer 23 (Al composition ratio: 0.08, film thickness: 200 nm, Ru concentration: $5 \times 10^{19}$ cm$^{-3}$, resistivity: $8 \times 10^7$ Ωcm) and a Ru-doped semi-insulating GaN buried layer 24 (film thickness: 50 nm, Ru concentration: $5 \times 10^{19}$ cm$^{-3}$, resistivity: $8 \times 10^7$ Ωcm) are grown. Then, a p-type cladding layer 13 and a p-type contact layer 14 are grown through the same process as in the above embodiments and a device is produced by cleavage.

This embodiment uses Ru as a semi-insulating dopant instead of Fe and since Ru is lower in diffusivity than Fe, even at a higher Ru concentration the semi-insulating dopant less diffuses into the p-type cladding layer or undoped active layer. Hence, the resistivity of the AlGaN buried layer can be increased without increasing the threshold current value and lateral leak current is blocked more effectively. In this sixth embodiment, the threshold current value can be decreased down to 14 mA, which is lower than in the fourth embodiment. In this embodiment the buried structure consists of only Ru-doped buried layers; however, since the growth condition is different between Ru doping and Fe doping, the buried structure may consist of a Ru-doped buried layer combined with a Fe-doped buried layer like the one used in the above embodiments, or it may consist of an AlGaN buried layer doped with both Ru and Fe.

Organic metal materials for Ru include bis($\eta^5$-2,4-dimethyl pentadienyle) ruthenium (II)$^3$), Ru(C$_2$H$_5$C$_5$H$_4$)$_2$, Ru(CH$_3$C$_5$H$_4$)$_2$, and Ru(C$_5$H$_5$)$_2$.

Although the first to sixth embodiments employ metalorganic vapor phase epitaxy as the crystal growth method, studies of chloride vapor phase epitaxy and molecular beam epitaxy as the latest growth methods for nitride semiconductors have been progressing. Nevertheless, metalorganic vapor phase epitaxy is more advantageous in terms of thin film control, selective growth, semi-insulating layer growth and so on. As the crystal growth method in the present invention, metalorganic vapor phase epitaxy is more desirable.

The present invention concerns blue-violet laser light sources for DVDs (around 405 nm wavelength) using nitride semiconductor lasers, and blue semiconductor lasers (420-490 nm) or green semiconductor lasers (490-550 nm) for RGB light sources for displays, and provides an industrially useful technique.

What is claimed is:

1. A nitride semiconductor laser comprising:
an n-type cladding layer, an active layer, a guide layer, a p-type cladding layer, and a p-type contact layer which are all formed over a semiconductor substrate, wherein:
the cross section of the p-type cladding layer partially includes an inverted trapezoidal portion,
a semi-insulating AlGaN layer is buried on both lateral sides of the inverted trapezoidal portion of the p-type cladding layer, and the p-type cladding layer lies over the AlGaN layer continuously with the inverted trapezoidal portion of the p-type cladding layer, and the p-type contact layer lies over the p-type cladding layer,
a mesa stripe as the inverted trapezoidal portion of the p-type cladding layer extends parallel to <1-100>, and a surface orientation of a tilted surface of the AlGaN layer in the inverted trapezoidal portion is (11-22), and the growth direction is in the semiconductor substrate <0001> direction, and
GaN layers lie on the tilted surface, upper surface and lower surface of the AlGaN layer.

2. A method of manufacturing a nitride semiconductor laser comprising the steps of:
(a) forming an n-type cladding layer, an active layer, and a guide layer or a partial p-type cladding layer;
(b) forming a stripe type mask parallel to a <1-100> direction on the guide layer or partial p-type cladding layer;
(c) forming a selectively-grown layer comprised of a semi-insulating layer of a AlGaN layer which has a (11-22) growth plane at both mask edges;
(d) removing the mask after step (c); and
(e) forming a p-type cladding layer on the semi-insulating AlGaN layer and the guide layer or partial p-type cladding layer.

3. The method of manufacturing a nitride semiconductor laser according to claim 2, wherein the buried layer includes a first and a second buried layer, and a tilted surface of the first buried layer is opposite to a tilted layer of the second buried layer and the distance between the tilted surfaces increases as the distance from a base layer increases, and the sectional shape of the p-type cladding layer portion lying between the tilted surfaces is inverted trapezoidal.

4. The method of manufacturing a nitride semiconductor laser according to claim 2, wherein metalorganic vapor phase epitaxy is used to form the buried layer.

5. The method of manufacturing a nitride semiconductor laser according to claim 2, wherein for the AlGaN material, Fe or Ru is used as a semi-insulating dopant and Fe or Ru dopant material is an organic metal.

6. A nitride semiconductor laser comprising:
an n-type cladding layer, an active layer, a guide layer, a p-type cladding layer, and a p-type contact layer which are all formed over a semiconductor substrate,
wherein a cross-section of the p-type cladding layer partially includes an inverted trapezoidal portion,
wherein the inverted trapezoidal portion of the p-type cladding layer has a mesa stripe shape,
wherein a semi-insulating AlGaN layer is buried on both lateral sides of the inverted trapezoidal portion of the p-type cladding layer,
wherein the p-type cladding layer lies over and below the semi-insulating AlGaN layer to cover a surface of the semi-insulating AlGaN layer, and
wherein the p-type contact layer lies over the p-type cladding layer.

7. The nitride semiconductor laser according to claim 6, wherein the inverted trapezoidal portion of the p-type cladding layer extends parallel to <1-100>, and a surface orientation of a tilted surface of the AlGaN layer in the inverted trapezoidal portion is (11-22), and wherein a growth direction of the AlGaN layer is in the semiconductor substrate <0001> direction.

8. The nitride semiconductor laser according to claim 6, wherein the p-type cladding layer is grown on first and second areas, wherein the first area is the semi-insulating AlGaN layer and the second area is an opening space between adjacent ones of the semi-insulating AlGaN layers, and wherein side growth planes of the semi-insulating AlGaN layer are (11-20) and (11-22) planes.

9. The nitride semiconductor laser according to claim 8, wherein a surrounding area of the semi-insulating AlGaN layer is covered by GaN layers, wherein the semi-insulating AlGaN layer is on a p-type GaN layer in a lower area of the semi-insulating AlGaN layer, and wherein the semi-insulating AlGaN layer is under a semi-insulating GaN layer in upper and side areas of semi-insulating AlGaN layer.

10. The nitride semiconductor laser according to claim 6, wherein a relation between the Al composition ratio in the buried semi-insulated AlGaN layer ($Al_B$) and the Al composition ratio in the p-type cladding layer comprised of AlGaN material, is $Al_B \geq Al_C$.

11. The nitride semiconductor laser according to claim 6, wherein the active region is etched perpendicularly to the growth plane, and a lateral side of the active region is buried by the semi-insulating AlGaN layer.

12. The nitride semiconductor laser according to claim 6, wherein the semi-insulating AlGaN layer has a resistivity of $1 \times 10^4$ Ωcm.

13. The nitride semiconductor laser according to claim 6, wherein the semi-insulating AlGaN layer has a resistivity of $1 \times 10^7$ Ωcm to $1 \times 10^{10}$ Ωcm.

14. The nitride semiconductor laser according to claim 7, wherein the semi-insulating AlGaN layer is on a first GaN layer,
and the top surface and the tilted surface is covered by a second GaN layer.

* * * * *